(12) United States Patent
Jeong et al.

(10) Patent No.: US 10,311,946 B2
(45) Date of Patent: Jun. 4, 2019

(54) SEMICONDUCTOR MEMORY DEVICE WITH ASSYMETRIC PRECHARGE

(71) Applicant: SAMSUNG ELECTRONICS CO., LTD., Suwon-si (KR)

(72) Inventors: Han-Wool Jeong, Seoul (KR); Woo-Jin Rim, Suwon-si (KR); Tae-Joong Song, Seongnam-si (KR); Seong-Ook Jung, Seoul (KR); Gyu-Hong Kim, Seoul (KR)

(73) Assignees: SAMSUNG ELECTRONICS CO., LTD., Gyeonggi-do, Suwon-si (KR); INDUSTRY-ACADEMIC COOPERATION FOUNDATION, YONSEI UNIVERSITY, Seodaemun-gu (KR)

( * ) Notice: Subject to any disclaimer, the term of this patent is extended or adjusted under 35 U.S.C. 154(b) by 0 days.

(21) Appl. No.: 15/221,875

(22) Filed: Jul. 28, 2016

(65) Prior Publication Data

US 2017/0053696 A1 Feb. 23, 2017

(30) Foreign Application Priority Data

Aug. 18, 2015 (KR) ........................ 10-2015-0116014

(51) Int. Cl.
| | |
|---|---|
| G11C 7/18 | (2006.01) |
| G11C 11/419 | (2006.01) |
| G11C 11/4091 | (2006.01) |

(52) U.S. Cl.
CPC .............. G11C 11/419 (2013.01); G11C 7/18 (2013.01); *G11C 11/4091* (2013.01); *G11C 2207/002* (2013.01)

(58) Field of Classification Search
CPC ..... G11C 7/18; G11C 11/4091; G11C 11/419; G11C 2207/002
See application file for complete search history.

(56) References Cited

U.S. PATENT DOCUMENTS

| | | | | |
|---|---|---|---|---|
| 4,866,674 A | * | 9/1989 | Tran ......................... | G11C 7/12 365/189.09 |
| 5,084,842 A | * | 1/1992 | Tsuchida ............. | G11C 11/4091 257/E27.085 |

(Continued)

FOREIGN PATENT DOCUMENTS

| | | |
|---|---|---|
| JP | 5-198180 A | 8/1993 |
| JP | 7-21774 A | 1/1995 |

(Continued)

OTHER PUBLICATIONS

Suzuki et al., "Threshold Difference Compensated Sense Amplifier," IEEE Journal of Solid-State Circuits vol. SC-14, Dec. 1979, pp. 1066-1070.*

(Continued)

*Primary Examiner* — Harry W Byrne
*Assistant Examiner* — R Lance Reidlinger
(74) *Attorney, Agent, or Firm* — Sughrue Mion, PLLC

(57) ABSTRACT

The semiconductor memory device includes: a memory cell; a sensing circuit connected to the memory cell via a first bit line and a second bit line different from the first bit line, the sensing circuit configured to sense data stored in the memory cell; and a bit line voltage control circuit connected to the memory cell via the first bit line and the second bit line, the bit line voltage control circuit configured to precharge the first bit line to a first voltage that is lower than a supply voltage and to precharge the second bit line to a second voltage that is lower than the supply voltage and is different from the first voltage.

18 Claims, 23 Drawing Sheets

(56) References Cited

U.S. PATENT DOCUMENTS

| | | | |
|---|---|---|---|
| 5,091,889 A * | 2/1992 | Hamano | G11C 7/22 365/189.05 |
| 5,864,511 A | 1/1999 | Sato | |
| 6,075,729 A | 6/2000 | Ohhata et al. | |
| 6,549,453 B2 * | 4/2003 | Wong | G11C 11/412 365/154 |
| 7,006,396 B2 | 2/2006 | Kodama | |
| 7,158,402 B2 | 1/2007 | Houston | |
| 7,826,293 B2 * | 11/2010 | Kim | G11C 7/062 365/205 |
| 7,965,569 B2 | 6/2011 | Koike et al. | |
| 8,279,687 B2 | 10/2012 | Adams et al. | |
| 8,406,073 B1 * | 3/2013 | Somasekhar | G11C 7/065 365/203 |

FOREIGN PATENT DOCUMENTS

| | | | |
|---|---|---|---|
| JP | 2003-257182 A | 9/2003 | |
| KR | 2001-0008674 A | 2/2001 | |
| KR | 10-0308127 B1 | 11/2001 | |
| KR | 10-0732390 B1 | 6/2007 | |

OTHER PUBLICATIONS

Taejoong Song et al., "13.2: A 14nm FinFET 128Mb 6T SRAM with $V_{MIN}$ Enhancement Techniques for Low-Power Applications", IEEE International Solid-State Circuits Conference(ISSCC), Digest of Technical Papers, Session 13, Advanced Embedded Memory, 13.2, 2014, (3 Pages Total) p. 232-4.

David Halupka et al., "Cross-coupled Bit-Line Biasing for 22-nm SRAM", Department of Electrical and Computer Engineering, University of Toronto, Toronto, ON, Canada, 2009, pp. 104-107. (IEEE).

* cited by examiner

SEMICONDUCTOR MEMORY DEVICE WITH ASSYMETRIC PRECHARGE

This application claims priority from Korean Patent Application No. 10-2015-0116014, filed on Aug. 18, 2015 in the Korean Intellectual Property Office, the disclosure of which is incorporated herein by reference in its entirety.

BACKGROUND

1. Field

Apparatuses and methods consistent with one or more exemplary embodiments relate to a semiconductor memory device.

2. Description of the Related Art

A semiconductor memory device refers to a storage device that is implemented with a semiconductor such as silicon (Si), germanium (Ge), gallium arsenide (GaAs), indium phosphide (InP), etc. Semiconductor memory devices are largely divided into volatile memory devices and non-volatile memory devices.

A volatile memory device loses data stored therein when power is interrupted. Volatile memory devices include a static random access memory (RAM) (SRAM), a dynamic RAM (DRAM), a synchronous DRAM (SDRAM), etc.

A non-volatile memory device retains data stored therein even when power is interrupted. Non-volatile memory devices include a read only memory (ROM), a programmable ROM (PROM), an electrically programmable ROM (EPROM), an electrically erasable and programmable ROM (EEPROM), a flash memory device, a resistive memory device (e.g., a phase-change RAM (PRAM), a ferroelectric RAM (FRAM), a resistive RAM (RRAM)), etc.

SUMMARY

Aspects of one or more exemplary embodiments provide a semiconductor memory device with an improved read operation speed.

Aspects of one or more exemplary embodiments also provide a semiconductor memory device capable of reducing power consumed by bit lines during a read operation.

Aspects of one or more exemplary embodiments also provide a semiconductor memory device with improved operation stability by minimizing disturbance between cells during a read operation.

It should be noted that objects of the present disclosure are not limited to the above-described objects, and other objects of the present disclosure will be apparent to those skilled in the art from the following descriptions.

According to an aspect of an exemplary embodiment, there is provided a semiconductor memory device including: a memory cell; a sensing circuit connected to the memory cell via a first bit line and a second bit line different from the first bit line, the sensing circuit configured to sense data stored in the memory cell; and a bit line voltage control circuit connected to the memory cell via the first bit line and the second bit line, the bit line voltage control circuit configured to precharge the first bit line to a first voltage that is lower than a supply voltage and to precharge the second bit line to a second voltage that is lower than the supply voltage and is different from the first voltage.

The bit line voltage control circuit may include a first transistor and a second transistor; and the first voltage may be lower than the supply voltage by a second threshold voltage of the second transistor, and the second voltage may be lower than the supply voltage by a first threshold voltage of the first transistor.

A first gate node of the first transistor may be connected to the second bit line, and a second gate node of the second transistor may be connected to the first bit line.

The bit line voltage control circuit may further include a third transistor connected between the first gate node and a first drain node of the first transistor, and a fourth transistor connected between the second gate node and a second drain node of the second transistor.

Each of the first to fourth transistors may be a p-type MOSFET.

The bit line voltage control circuit may be configured to precharge the first bit line to the first voltage and the second bit line to the second voltage during a precharge operation, and to amplify a difference value between the first voltage and the second voltage during a read operation subsequent to the precharge operation.

The bit line voltage control circuit may be configured to equalize a voltage at the first bit line with a voltage at the second bit line after a sensing operation by the sensing circuit is completed.

According to an aspect of another exemplary embodiment, there is provided a semiconductor memory device including: a memory cell connected between a first bit line and a second bit line; and a bit line voltage control circuit connected between the first bit line and the second bit line, the bit line voltage control circuit configured to apply a first precharge voltage to the first bit line and a second precharge voltage to the second bit line, wherein the bit line voltage control circuit includes a first transistor, a second transistor, a first switch, and a second switch, wherein a first gate node of the first transistor is connected to the second bit line, wherein the first gate node and a first drain node of the first transistor are connected to the first switch, wherein a second gate node of the second transistor is connected to the first bit line, and wherein the second gate node and a second drain node of the second transistor are connected to the second switch.

The first precharge voltage may be different from the second precharge voltage.

The first precharge voltage may be lower than a supply voltage by a second threshold voltage of the second transistor, and the second precharge voltage may be lower than the supply voltage by a first threshold voltage of the first transistor.

The first switch and the second switch may be switched on when a precharge operation is performed on the first bit line and the second bit line.

The first switch and the second switch may be switched off when a sensing operation is performed on the memory cell.

Each of the first switch and the second switch may include a p-type MOSFET.

The bit line voltage control circuit may further include a third switch connected between the first drain node of the first transistor and the first bit line, and a fourth transistor connected between the second drain node of the second transistor and the second bit line.

The third switch and the fourth switch may be switched on when a sensing operation is performed on the memory cell.

Each of the third switch and the fourth switch may include a p-type MOSFET.

According to an aspect of another exemplary embodiment, there is provided a semiconductor memory device including: a memory cell; a sensing circuit configured to sense data stored in the memory cell; and a bit line voltage control circuit connected to the memory cell via a first bit line and a second bit line, wherein the bit line voltage control circuit is configured to apply a first precharge voltage to the first bit line and apply a second precharge voltage to the second bit line during a precharge period, the first precharge voltage being different from the second precharge voltage, and wherein a first voltage at the first bit line decreases and a second voltage at the second bit line increases during a sensing period.

The bit line voltage control circuit may include a first transistor and a second transistor; and a first gate node of the first transistor may be connected to the second bit line, and a second gate node of the second transistor may be connected to the first bit line.

The first precharge voltage may be lower than a supply voltage by a second threshold voltage of the second transistor, and the second precharge voltage may be lower than the supply voltage by a first threshold voltage of the first transistor.

The bit line voltage control circuit may further include a first switch connected between the first gate node and a first drain node of the first transistor, and a second switch connected between the second gate node and a second drain node of the second transistor.

The first switch and the second switch may be switched on during the precharge period.

The bit line voltage control circuit may further include a third switch connected between the first drain node of the first transistor and the first bit line, and a fourth transistor connected between the second drain node of the second transistor and the second bit line.

The third switch and the fourth switch may be switched on during the sensing period.

The memory cell may be a static random access memory (SRAM) cell.

According to an aspect of another exemplary embodiment, there is provided a semiconductor memory device including: a memory cell connected between a first bit line and a second bit line; and a bit line voltage control circuit connected between the first bit line and the second bit line, the bit line voltage control circuit configured to apply a first precharge voltage, lower than a supply voltage, to the first bit line and apply a second precharge voltage, lower than the supply voltage and different from the first precharge voltage, to the second bit line.

The bit line voltage control circuit may include a first transistor, a second transistor, a first switch, and a second switch; a first gate node of the first transistor may be connected to the second bit line; the first gate node and a first drain node of the first transistor may be connected to the first switch; a second gate node of the second transistor may be connected to the first bit line; and the second gate node and a second drain node of the second transistor may be connected to the second switch.

The first precharge voltage may be lower than the supply voltage by a second threshold voltage of the second transistor, and the second precharge voltage may be lower than the supply voltage by a first threshold voltage of the first transistor.

BRIEF DESCRIPTION OF THE DRAWINGS

The above and other aspects and features will become more apparent by describing in detail exemplary embodiments with reference to the attached drawings, in which.

DETAILED DESCRIPTION OF EXEMPLARY EMBODIMENTS

Figure 1:
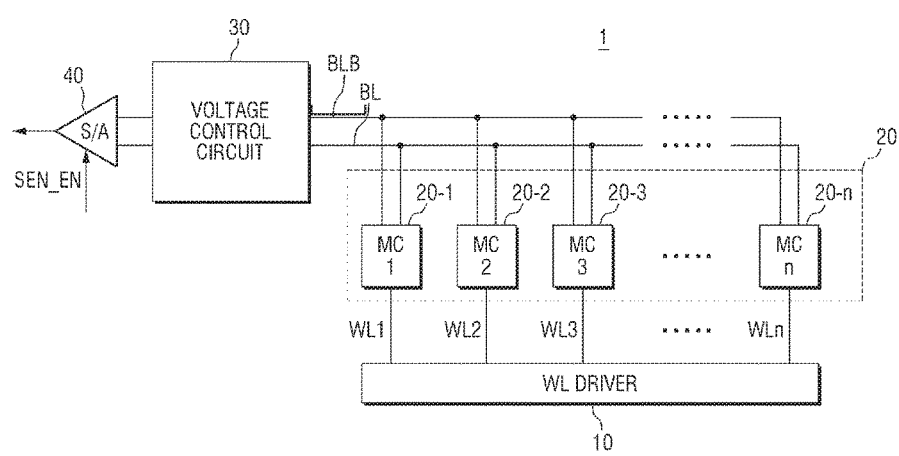
FIG. 1 is a block diagram of a semiconductor memory device according to one or more exemplary embodiments.

Exemplary embodiments will now be described more fully hereinafter with reference to the accompanying drawings. An exemplary embodiment may, however, be embodied in different forms and should not be construed as limited to exemplary embodiments set forth herein. Rather, these exemplary embodiments are provided so that this disclosure will be thorough and complete, and will filly convey the scope of the inventive concept to those skilled in the art. The same reference numbers indicate the same components throughout the specification. In the attached figures, the thickness of layers and regions is exaggerated for clarity.

The use of the terms "a" and "an" and "the" and similar referents in the context of describing exemplary embodiments (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which exemplary embodiments belong. It is noted that the use of any and all examples, or exemplary terms provided herein, is intended merely to better illuminate exemplary embodiments and is not a limitation on the scope of the invention unless otherwise specified. Further, unless defined otherwise, all terms defined in generally used dictionaries may not be overly interpreted.

Exemplary embodiments will be described with reference to perspective views, cross-sectional views, and/or plan views. Thus, the profile of an exemplary view may be modified according to manufacturing techniques and/or allowances. That is, the described exemplary embodiments are not intended to limit the scope of the present invention but cover all changes and modifications that can be caused due to a change in manufacturing process. Thus, regions shown in the drawings are illustrated in schematic form and the shapes of the regions are presented simply by way of illustration and not as a limitation.

In the following descriptions, a static RAM (SRAM) will be described as an example of a memory device. However, it is to be understood that the memory device according to one or more other exemplary embodiments is not limited to the SRAM to be described hereinafter.

Aspects of one or more exemplary embodiments relate to a bit line voltage control circuit that improves read speed of an SRAM cell including differential bit lines, stabilizes disturbance between cells, and reduces bit line power consumption. Typically, two bit lines of an SRAM are precharged to the supply voltage $V_{DD}$ by a bit line voltage control circuit prior to a read operation. During the read operation, the two bit lines of the SRAM are left floating. If a selected SRAM cell is connected to the two bit lines, a voltage difference between the two bit lines becomes larger depending on the data stored in the SRAM cell.

For high integration, an SRAM cell includes small transistors. Accordingly, the amount of cell current for obtaining a voltage difference between two bit lines during a read operation is small. On the contrary, the capacitance of the bit lines is large since the bit lines are shared by a number of SRAM cells. As a result, it takes a relatively long time to increase the voltage difference between the two bit lines above an offset voltage of the sensing circuit, thereby slowing down the read operation.

According to an aspect of an exemplary embodiment, a voltage difference between two bit lines is obtained by using a bit line voltage control circuit including cross-coupled transistors (e.g., metal-oxide semiconductor field-effect transistors (MOSFET)) in addition to the operation of an SRAM cell during a read operation, thereby improving the read operation speed.

According to an aspect of an exemplary embodiment, the bit line voltage control circuit may be diode-connected to the two bit lines to precharge the bit lines to voltages lower than the supply voltage $V_{DD}$ by threshold voltages (e.g., predetermined threshold voltages) of the transistors, respectively, during a precharge period, and may be cross-coupled to the two bit lines to perform a read operation during a sensing period. In this manner, if a voltage at one of the bit lines becomes lower by an SRAM cell, a voltage at the other becomes higher by the cross-coupled transistors, and thus the voltage difference between the two bit lines can be increased above the offset voltage of the sensing circuit more quickly.

In addition, according to an aspect of an exemplary embodiment, each of the bit lines is precharged to the voltage lower than the supply voltage $V_{DD}$ by the threshold voltage Vth of the respective transistors, and the time for which an SRAM cell is connected to the bit lines is shortened as a result of the read operation improvement, so that the swing width of the bit line voltages is reduced. As a result, the power consumed by the bit lines can be reduced.

In addition, according to an aspect of an exemplary embodiment, each of the bit lines is precharged to the voltage lower than the supply voltage $V_{DD}$ by the threshold voltage Vth of the respective transistors during the precharge period, and thus disturb noise introduced into a selected word line when the word line is turned on. As a result, disturbance by a half-selected SRAM can be reduced, and the operation stability of the memory can be improved.

Hereinafter, a semiconductor memory device according to one or more exemplary embodiments will be described with reference to FIGS. 1 to 19.

Figure 2:
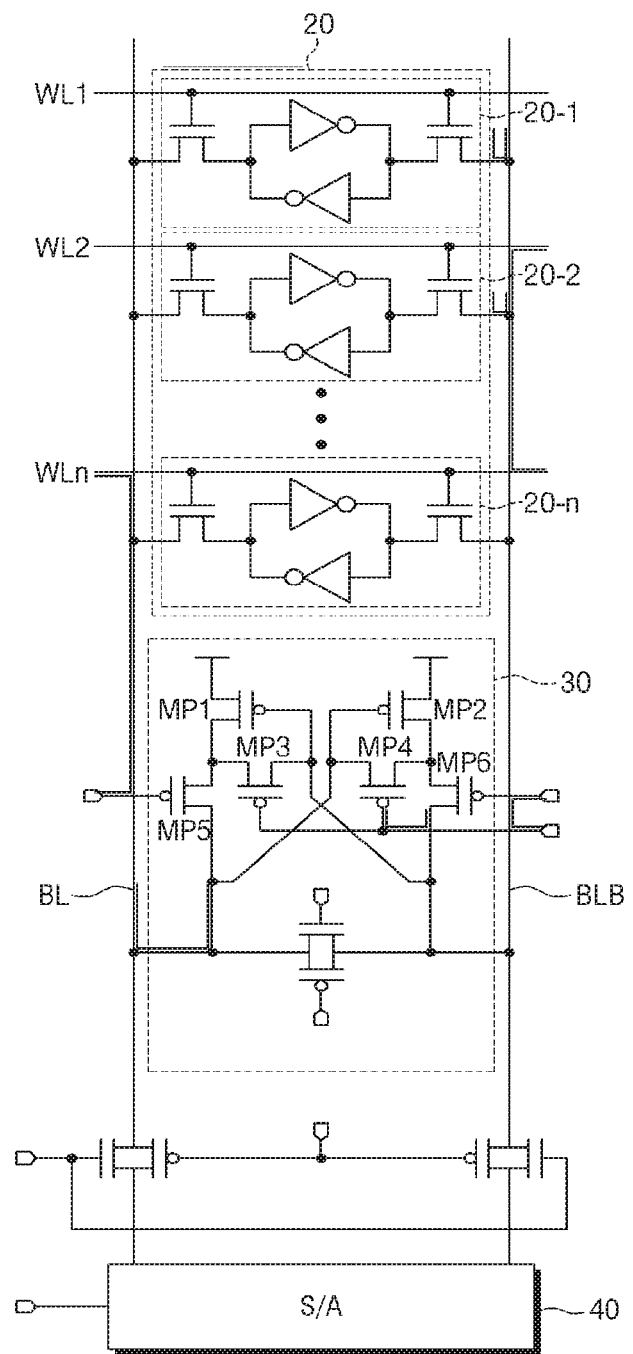
FIG. 2 is an example circuit diagram of a semiconductor memory device according to one or more exemplary embodiments.
Figure 3:
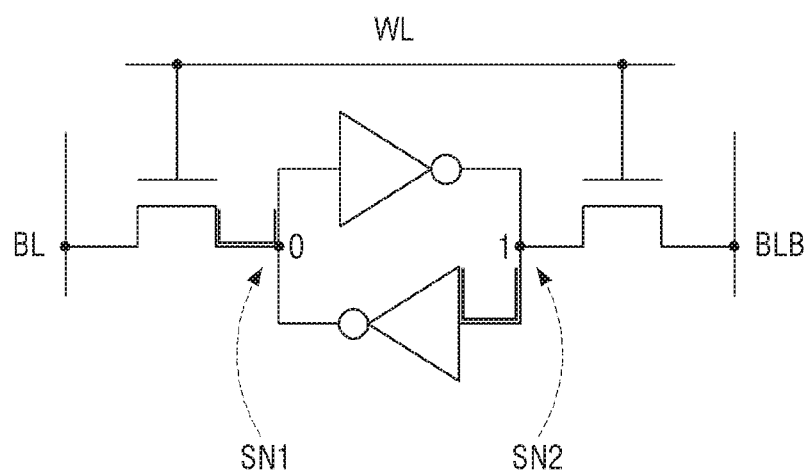
FIGS. 3 and 4 are diagrams showing an example configuration of the first memory cell shown in FIG. 1.
Figure 4:
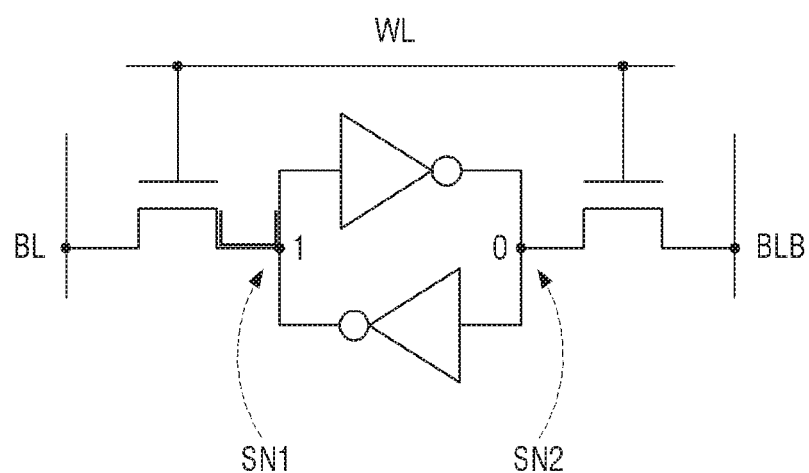
Figure 5:
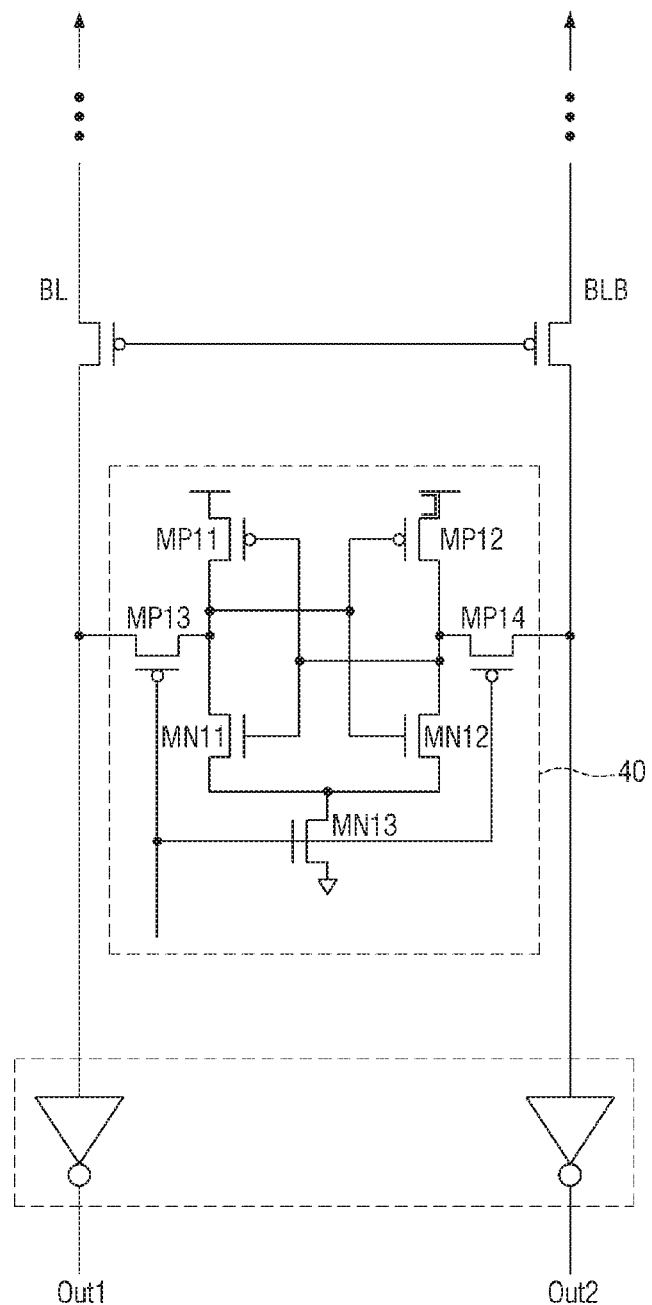
FIG. 5 is a diagram showing an example configuration of the sensing circuit of FIG. 1.
Figure 6:
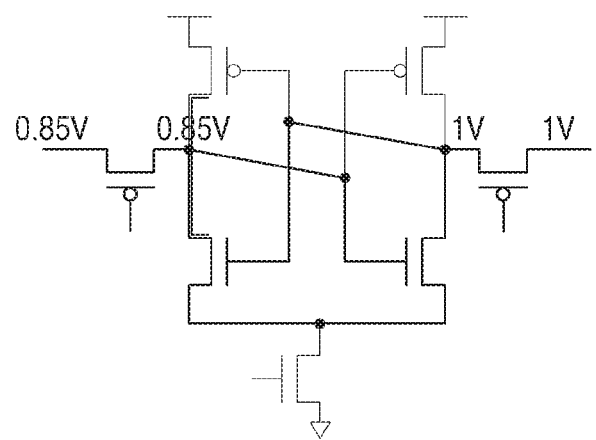
FIGS. 6 to 9 are diagrams for illustrating a sensing operation by the sensing circuit in detail, according to one or more exemplary embodiments.
Figure 7:
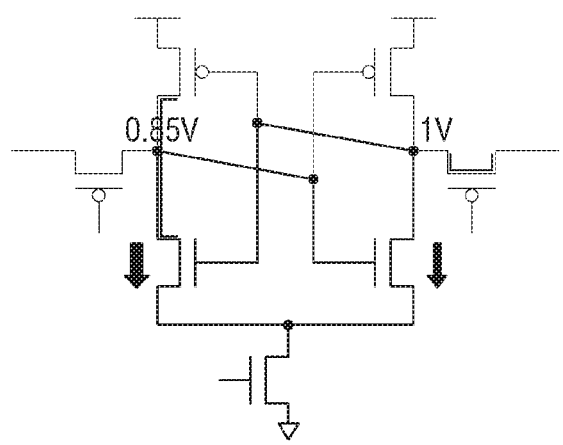
Figure 8:
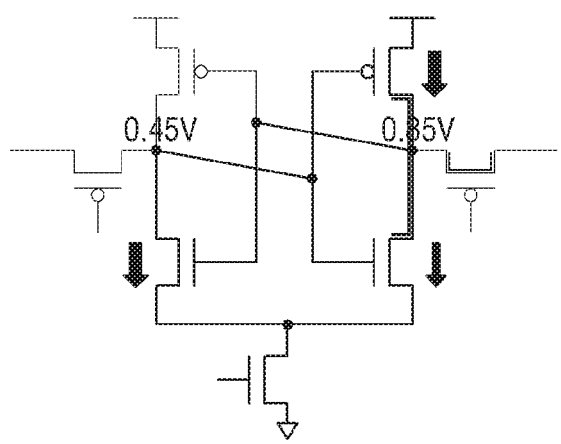
Figure 9:
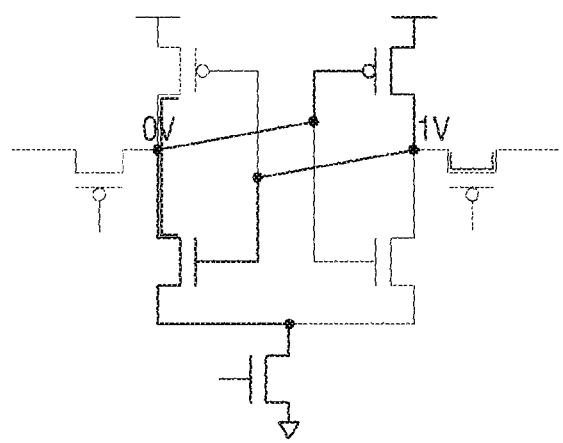

FIG. 1 is a block diagram of a semiconductor memory device 1 according to one or more exemplary embodiments. FIG. 2 is an example circuit diagram of a semiconductor memory device 1 according to one or more exemplary embodiments. FIGS. 3 and 4 are diagrams showing an example configuration of a first memory cell shown in FIG. 1. FIG. 5 is a diagram showing an example configuration of a sensing circuit 40 of FIG. 1.

Referring to FIG. 1, a semiconductor memory device 1 may include a word line driver 10, a group of memory cells 20, a bit line voltage control circuit 30, and a sensing circuit 40.

The word line driver 10 can be connected to each of memory cells 20-1 to 20-n of the group of memory cells 20. The group of memory cells 20 may include a plurality of memory cells 20-1 to 20-n. In one or more exemplary embodiments, each of the memory cells 20-1 to 20-n may be a static RAM (SRAM). However, the type of the memory cells is not limited to the SRAM, but may be other types of memory cells in one or more other exemplary embodiments.

The bit line voltage control circuit 30 may be connected to each of the memory cells 20-1 to 20-n via a first bit line BL and a second bit line BLB, may precharge the first bit line BL to a first precharge voltage V1 lower than a supply voltage $V_{DD}$, and may precharge the second bit line BLB to a second precharge voltage V2 lower than the supply voltage $V_{DD}$. The first precharge voltage V1 is different from the second precharge voltage V2. The operation of the bit line voltage control circuit 30 will be described in more detail below.

The sensing circuit 40 may be connected to each of the memory cells 20-1 to 20-n via the first bit line BL and the second bit line BLB to sense data stored in each of the memory cells 20-1 to 20-n. The sensing circuit 40 may be implemented as, but is not limited to, a sense amplifier as shown in FIG. 1. The operation of the sensing circuit 40 will be described in more detail below.

Hereinafter, the configuration and operation of the semiconductor memory device 1 will be described in detail.

The word line driver 10 may apply word line signals WL1 to WLn to the memory cells 20-1 to 20-n, respectively. Specifically, when the semiconductor memory device 1 performs a read operation, the word line driver 10 applies the word line signals WL1 to WLn to the memory cells 20-1 to 20-n, respectively, to select the memory cells 20-1 to 20-n.

The group of memory cells 20 may include the plurality of memory cells 20-1 to 20-n. The plurality of memory cells 20-1 to 20-n may be disposed in several blocks. That is, each of the blocks may include some of the plurality of memory cells 20-1 to 20-n.

Data may be stored in each of memory cells 20-1 to 20-n in any of a variety of ways (including those well known in the related art) for writing data into a memory.

As shown in FIG. 2, each of the memory cells 20-1 to 20-n according to one or more exemplary embodiments may include a pair of inverters, and first and second pass transistors. The gate node of each of the first and second pass transistors MN1 and MN2 may be connected to the first word line signal WL1.

FIGS. 3 and 4 are diagrams showing an example configuration of a first memory cell 20-1 among the plurality of memory cells 20-1 to 20-n.

Referring to FIGS. 3 and 4, the pair of inverters may serve to store data. Herein, for convenience of illustration, data stored in each of the memory cells 20-1 to 20-n is defined as shown in Table 1 below:

TABLE 1

| Data | First Node (SN1) | Second Node (SN2) |
|---|---|---|
| 0 | L | H |
| 1 | H | L |

As can be seen from Table 1, it is defined that data of 0 is stored in each of memory cells 20-1 to 20-n when the voltage level of a first node SN1 is a first level (e.g., Low level) and the voltage level of a second node SN2 is a second level (e.g., High level). Further, it is defined that data of 1 is stored in each of memory cells 20-1 to 20-n when the voltage level of the first node SN1 is the second level (e.g., High level) and the voltage level of the second node SN2 is the first level (e.g., Low level).

In FIGS. 3 and 4, each of the first and second pass transistors is configured as an NMOS transistor (e.g., n-type MOSFET) that is turned on when the first word line signal WL1 at the second level (e.g., High level) is applied. However, the type of the first and second pass transistors is not limited to an NMOS transistor. In one or more exemplary embodiments, each of the first and second pass transistors may be configured as a PMOS transistor (e.g., p-type MOSFET) that is turned on when the first word line signal WL1 at the first level (e.g., Low level) is applied.

When a read operation is performed on each of the memory cells 20-1 to 20-n, it is transferred to an output stage whether the data stored in each of the memory cells 20-1 to 20-n is 0 or 1. The read operation on the first memory cell 20-1 is performed as follows: after the first bit line BL and the second bit line BLB are precharged to certain voltages, the first word line signal WL becomes T such that the first node SN1 and the second node SN2 of the first memory cell 20-1 are connected to the first bit line BL and the second bit line BLB, respectively. Then, the voltages at the first bit line BL and the second bit line BLB are changed depending on data stored in the first memory cell 20-1, and the sensing circuit 40 senses the voltages at the first bit line BL and the second bit line BLB and transfers the sensed voltages to the output stage.

When the read operation is initiated on each of the memory cells 20-1 to 20-n, the word line signal of the selected one of the plurality of memory cells 20-1 to 20-n becomes 1. For example, let us consider the first word line signal WTL1 becomes '1' such that a read operation is performed on the first memory cell 20-1. When the data stored in the first memory cell 20-1 is '0' (i.e., the voltage level of the first node SN1 is the first level (e.g., Low level) and the voltage level of the second node SN2 is the second level (e.g., High level)), a cell current flows into the first memory cell 20-1 from the first bit line BL and thus the voltage at the first bit line BL decreases and the voltage at the second bit line BLB increases. Accordingly, the voltage difference is obtained between the first bit line BL and the second bit line BLB and is transferred to the sensing circuit 40, so that the sensing circuit 40 performs the sensing operation. The sensing operation by the sensing circuit 40 is performed based on the voltage difference between the first bit line BL and the second bit line BLB. The voltage at which one of the bit lines has decreased is sensed, and the sensing circuit 40 transfers to the end output stage a digital output of 0 or 1 based on the sensing result.

FIG. 5 is a diagram showing an example configuration of the sensing circuit 40 of FIG. 1. FIGS. 6 to 9 are diagrams for illustrating the sensing operation by the sensing circuit in detail.

Referring to FIG. 5, the sensing circuit 40 may be connected to each of the memory cells 20-1 to 20-n via the first bit line BL and the second bit line BLB. The sensing circuit 40 may sense data stored in each of the memory cells 20-1 to 20-n by sensing changes in the voltages at the first bit line BL and the second bit line BLB. The sensing circuit 40 may include eleventh to fourteenth PMOS transistors MP11, MP12, MP13 and MP14, and the eleventh to thirteenth NMOS transistors MN11, MN12 and MN13. In addition, inverters that form output stages Out1 and Out2 of the sensing circuit 40 may be connected to the drain nodes of the thirteenth and fourteenth PMOS transistors MP13 and MP14.

In the sensing circuit 40, the common gate node of the eleventh PMOS transistor MP11 and the eleventh NMOS transistor MN11 may be connected to the drain node of the twelfth PMOS transistor MP12 and the drain node of the twelfth NMOS transistor MN12. In addition, the common gate node of the twelfth PMOS transistor MP12 and the twelfth NMOS transistor MN12 may be connected to the drain node of the eleventh PMOS transistor MP11 and the drain node of the eleventh NMOS transistor MN11. Further, the common gate node of the third PMOS transistor MP12 and the fourteenth PMOS transistor MP14 may be connected to an enable signal line for enabling the sensing circuit 40. The common source of the eleventh NMOS transistor MN11 and the twelfth NMOS transistor MN12 may be referenced to the ground potential via the thirteenth NMOS transistor MN13 which works as a selecting transistor. When a sense amplifier enable signal is activated, the common source of the first and second NMOS transistors MN11 and MN12 may be referenced to the ground potential. Accordingly, the sensing operation by the sensing circuit 40 is feasible.

Reference will now be made to FIGS. 6 to 9, with the assumption (for convenience of description) that the voltage applied to the first bit line BL is 0.85 V, and the voltage applied to the second bit line BLB is 1 V. Then, the voltage applied to the gate node of the eleventh NMOS transistor MN11 becomes 1V, and the voltage applied to the gate node of the twelfth NMOS transistor MN12 becomes 0.85V. Accordingly, upon the sense amplifier enable signal being applied, the amount of pull-down current of the eleventh NMOS transistor MN11 becomes larger than the amount of pull-down current of the twelfth NMOS transistor MN12, and the difference between the voltage at the first bit line BL and the voltage at the second bit line BLB becomes larger in response to a positive feedback signal, thereby creating pull-up current. As a result, the voltage at the first bit line BL becomes 0 V and the voltage at the second bit line BLB becomes 1 V, so that the voltage signals can be in the form of digital signals. In this manner, the sensing operation by the sensing circuit 40 may be performed.

In this regard, there is a problem in that mismatch between transistors may occur during the process of manufacturing the sensing circuit 40 due to process variations. The operation by the sensing circuit 40 including mismatch between transistors will now be described with reference to FIGS. 10 to 14.

Figure 10:
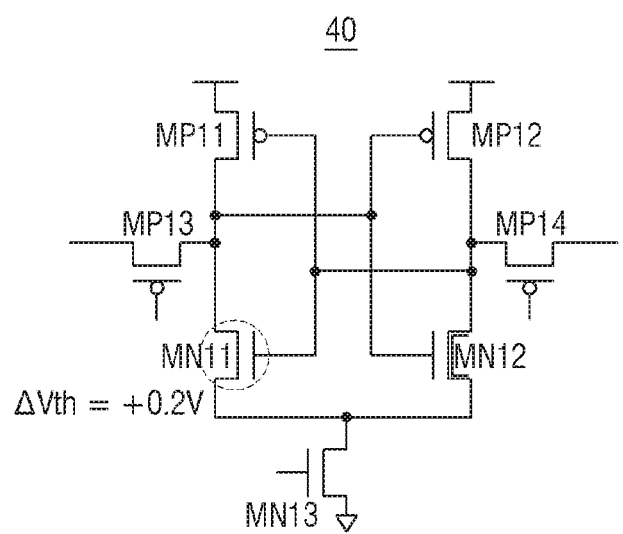
FIG. 10 is a diagram showing an example configuration of a sensing circuit where mismatch between transistors has occurred.
Figure 11:
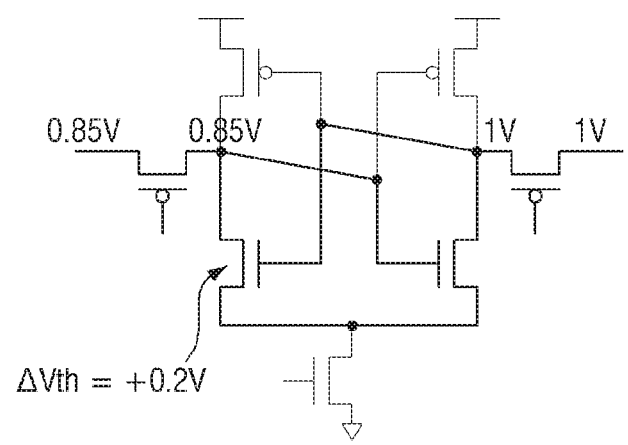
FIGS. 11 to 14 are diagrams for illustrating a sensing operation by the sensing circuit of FIG. 10 in detail.
Figure 12:
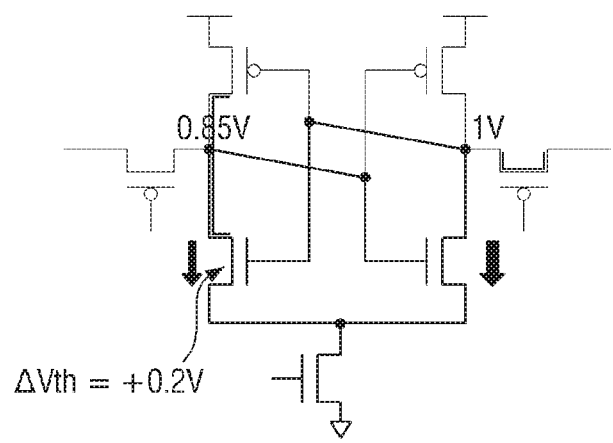
Figure 13:
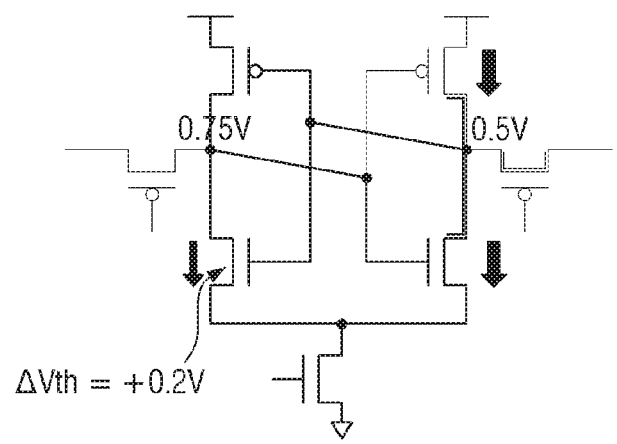
Figure 14:
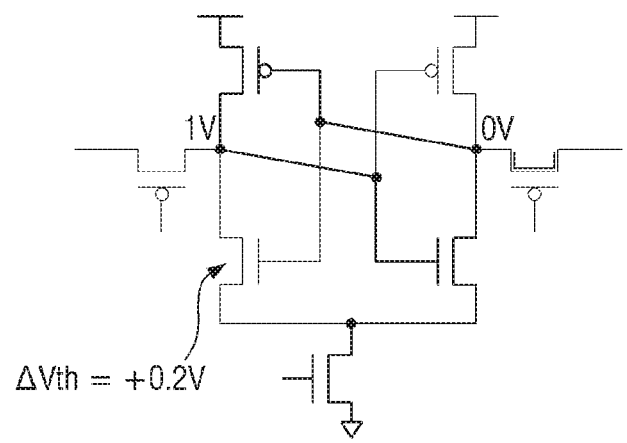

FIG. 10 is a diagram showing an example configuration of a sensing circuit where mismatch between transistors has occurred. FIGS. 11 to 14 are diagrams for illustrating the sensing operation by the sensing circuit of FIG. 10 in detail.

FIG. 10 shows an example in which mismatch occurs between the eleventh NMOS transistor MN11 and the twelfth NMOS transistor MN12 working as pull-down transistors. Specifically, in the example, the threshold voltage of the eleventh NMOS transistor MN11 is greater than the threshold voltage of the twelfth NMOS transistor MN12 by 0.2 V. If mismatch occurs between transistors in the symmetric structure, the sensing circuit 40 fails to perform the sensing operation normally and may operate erroneously.

Reference will now be made to FIGS. 11 to 14, with the assumption (for convenience of description) that the voltage applied to the first bit line BL is 0.85 V, and the voltage applied to the second bit line BLB is 1 V. Then, the voltage applied to the gate node of the eleventh NMOS transistor MN11 becomes 1 V, and the voltage applied to the gate node of the twelfth NMOS transistor MN12 becomes 0.85 V. Since the threshold voltage of the eleventh NMOS transistor MN11 is greater than the threshold voltage of the twelfth NMOS transistor MN12 by 0.2 V, however, the amount of pull-down current of the twelfth NMOS transistor MN12 becomes larger than the amount of pull-down current of the eleventh NMOS transistor MN11, and the voltage at the second bit line BLB becomes lower than the voltage at the first bit line BL in response to a positive feedback signal. Accordingly, the voltage at the first bit line BL becomes 1 V and the voltage at the second bit line BLB becomes 0 V, so that an incorrect digital signal may be output in the course that the voltage signals are converted to digital signals. As a result, an error takes place in the sensing operation by the sensing circuit 40.

Even when such mismatch occurs between the transistors, it is possible to prevent the sensing circuit 40 from being erroneously operated by delaying the sensing operation until the voltage difference between the first bit line BL and the second bit line BLB becomes greater than the offset voltage of the sensing circuit 40.

As the manufacturing process of semiconductor memory devices becomes more and more sophisticated and the process variations become larger, mismatch between transistors in the sensing circuit 40 in the symmetric structure is more likely to occur. Accordingly, the offset voltage of the sensing circuit 40 is increased, as is a waiting time until the voltage difference between the first bit line BL and the second bit line BLB becomes larger than the offset voltage of the sensing circuit 40. This slows down the overall read operation, and increases power consumption for generating the voltage difference between the first bit line BL and the second bit line BLB up to a desired level.

The increase in the process variations also adversely affects the cell current flowing in the memory cells 20-1 to 20-n when the read operation is performed. Typically, the memory cells 20-1 to 20-n are designed to be implemented with small transistors for high integration. Therefore, the amplitude of the cell current becomes relatively small, which has a major influence in obtaining the voltage difference between the first bit line BL and the second bit line BLB. If the process variations are larger, the threshold voltages of transistors in the memory cells 20-1 to 20-n may become larger, so that the amplitude of the cell current may become even smaller. On the contrary, the first bit line BL or the second bit line BLB are shared by the plurality of memory cells 20-1 to 20-n, and thus the capacitance of the first bit line BL or the second bit line BLB becomes larger. As a result, it takes a longer time to obtain the voltage difference between the first bit line BL and the second bit line BLB as they have a relatively larger capacitance with a relatively small cell current.

By introducing the bit line voltage control circuit 30 according to an aspect of an exemplary embodiment, after the first bit line BL and the second bit line BLB are precharged to voltages lower than supply voltage $V_{DD}$, a voltage difference between the first bit line BL and the second bit line BLB is obtained by using cross-coupled PMOS transistors in the bit line voltage control circuit 30 upon a read operation being initiated, in addition to by a cell current. As a result, the read operation speed can be improved and the power consumption can be reduced.

In particular, by employing the bit line voltage control circuit 30 according to an aspect of an exemplary embodiment, the first bit line BL and the second bit line BLB are precharged via a diode connection of the cross-coupled PMOS transistors in the bit line voltage control circuit 30, so that the first bit line BL and the second bit line BLB can be precharged with voltages lower than the supply voltage $V_{DD}$ without any additional power source. Precharge may be performed taking into account mismatch between the cross-coupled PMOS transistors so that the cross-coupled PMOS transistors in the bit line voltage control circuit 30 can be operated immediately after a read operation is initiated.

Hereinafter, the bit line voltage control circuit 30 according to one or more exemplary embodiments will be described with reference to FIGS. 2, 15, and 16.

Figure 15:
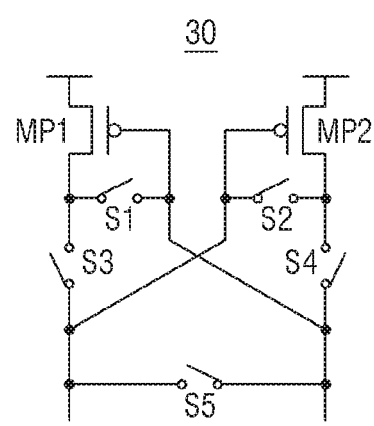
FIG. 15 is an equivalent circuit diagram of the bit line voltage control circuit of FIG. 2 that represents the configuration of switches, according to an exemplary embodiment.

FIG. 15 is an equivalent circuit diagram of the bit line voltage control circuit of FIG. 2 that represent the configuration of switches. FIG. 16 is a timing chart showing the operation of a semiconductor memory device according to one or more exemplary embodiments.

Referring to FIG. 2, the bit line voltage control circuit 30 included in the semiconductor memory device 1 may include the first PMOS transistor MP1, the second PMOS transistor MP2, the third PMOS transistor MP3, the fourth PMOS transistor MP4, the fifth PMOS transistor MP5, and the sixth PMOS transistor MP6.

In the bit line voltage control circuit 30, each of the source node of the first PMOS transistor MP1 and the source node of the second PMOS transistor MP2 may be connected to a voltage source to receive supply voltage $V_{DD}$. In addition, the gate node of the first PMOS transistor MP1 is connected to the second bit line BLB and the gate node of the second PMOS transistor MP2 is connected to the first bit line BL. Accordingly, the bit line voltage control circuit 30 includes a cross-coupled connection. The gate node and the drain node of the first PMOS transistor MP1 may be connected to the source node and the drain node of the third PMOS transistor MP3, respectively. The gate node and the drain node of the second PMOS transistor MP2 may be connected to the source node and the drain node of the fourth PMOS transistor MP4, respectively. The gate node of the third PMOS transistor MP3 and the gate node of the fourth PMOS transistor MP4 may be connected to a precharge enable signal line.

In the bit line voltage control circuit 30, each of the gate node of the fifth PMOS transistor MP5 and the gate node of the sixth PMOS transistor MP6 may be connected to a read enable signal line. The source node of the fifth PMOS transistor MP5 may be connected to the drain node of the first PMOS transistor MP1 and the drain node of the third PMOS transistor MP3. The source node of the sixth PMOS transistor MP6 may be connected to the drain node of the second PMOS transistor MP2 and the drain node of the fourth PMOS transistor MP4.

Referring to FIG. 15, an equivalent circuit diagram of the bit line voltage control circuit 30 according to one or more exemplary embodiments is shown that represents the configuration of switches. The bit line voltage control circuit 30 may include a first switch S1 connected between the gate node and the drain node of the first PMOS transistor MP1 and a second switch S2 connected between the gate node and the drain node of MP2. In addition, the bit line voltage control circuit 30 may include a third switch S3 connected between the drain node of the first PMOS transistor MP1 and the first bit line BL and a fourth switch S4 connected between the drain node of the second PMOS transistor MP2 and the second bit line BLB. Further, the bit line voltage control circuit 30 may include a fifth switch S5 connected between the first bit line BL and the second bit line BLB. The operations of the first to fifth switches S1 to S5 will be described in detail below.

Figure 16:
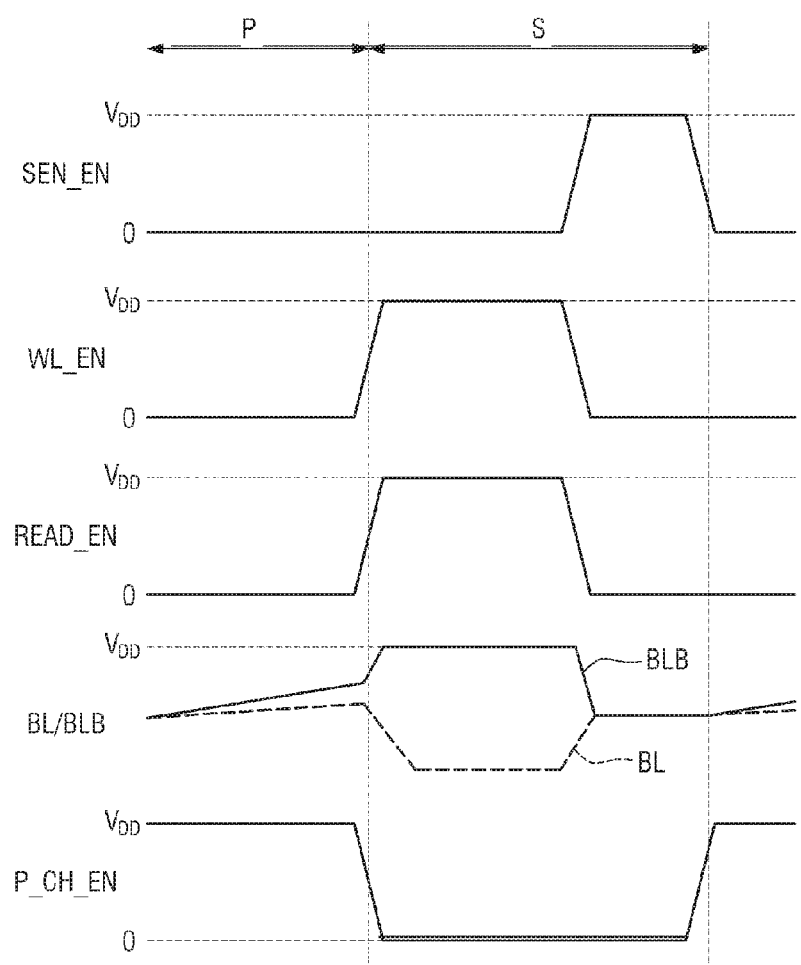
FIG. 16 is a timing chart showing the operation of a semiconductor memory device according to one or more exemplary embodiments.

Referring to FIG. 16, upon a precharge enable signal P_CH_EN being applied, the bit line voltage control circuit 30 of the semiconductor memory device 1 precharges the first bit line BL to a first precharge voltage V1 during a precharge period P and precharges the second bit line BLB to a second precharge voltage V2. The first precharge voltage V1 is lower than the supply voltage $V_{DD}$ by a second threshold voltage Vth2 of the second PMOS transistor MP2, and the second precharge voltage V2 is lower than the supply voltage $V_{DD}$ by a first threshold voltage Vth1 of the first PMOS transistor MP1. As can be seen from FIG. 16, the first precharge voltage V1 is lower than the second precharge voltage V2 during the precharge period P.

Then, in the semiconductor memory device 1, after the precharge period P expires, a read enable signal READ_EN is applied, followed by a word line enable signal WL_EN being applied, so that a memory cell is selected. Then, upon a sense amplifier enable signal SEN_EN being applied during a sensing period S, the sensing operation by the sensing circuit 40 is performed on the selected memory. In the sensing period S, the voltage at the first bit line BL decreases and the voltage at the second bit line BLB increases. The sensing circuit 40 receives a voltage difference between the first bit line BL and the second bit line BLB to perform the sensing operation. While the sensing operation is performed, the voltage at the first bit line BL and the voltage at the second bit line BLB return to initial values, and the semiconductor memory device 1 prepares for a subsequent precharge operation.

Figure 17:
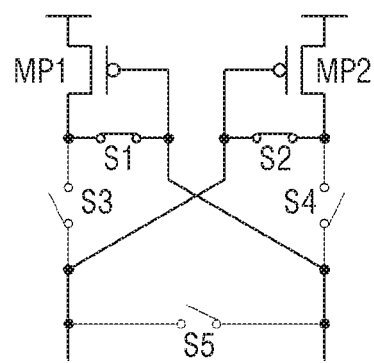
FIGS. 17 to 19 are diagrams for illustrating operations of an equivalent circuit of a bit line voltage control circuit according to one or more exemplary embodiments that represents the configuration of switches.
Figure 18:
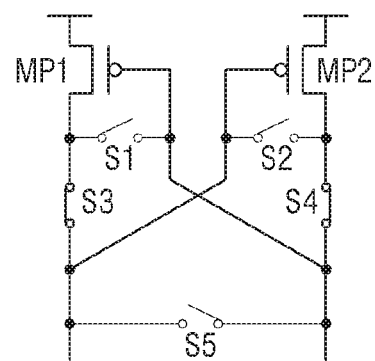
Figure 19:
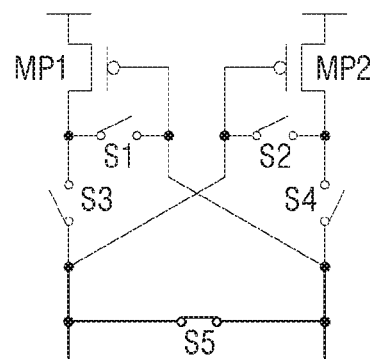

FIGS. 17 to 19 are diagrams for illustrating operations of an equivalent circuit of a bit line voltage control circuit according to one or more exemplary embodiments.

Initially, referring to FIG. 17, the first switch S1 and the second switch S2 of the bit line voltage control circuit 30 are switched on during the precharge period P. Accordingly, the first bit line BL is precharged to the first precharge voltage V1 that is lower than the supply voltage $V_{DD}$ by the second threshold voltage Vth2 of the second PMOS transistor MP2. Further, the second bit line BLB is precharged to the second precharge voltage V2 that is lower than the supply voltage $V_{DD}$ by the first threshold voltage Vth1 of the first PMOS transistor MP1.

Subsequently, referring to FIG. 18, during the sensing period S, before the sense amplifier enable signal SEN_EN increases, the first switch S1 and the second switch S2 are switched off and the third switch S3 and the fourth switch S4 are switched on. Accordingly, a positive feedback signal regarding the amount of pull-down current of the cross-coupled first and second PMOS transistors MP1 and MP2 is generated, so that the voltage difference between the first bit line BL and the second bit line BLB is amplified.

Subsequently, referring to FIG. 19, during the sensing period S, after the sense amplifier enable signal SEN_EN increases, all of the first to fourth switches S1 to S4 are switched off and the fifth switch S5 is switched on, so that an equalization process is performed to equalize the voltage at the first bit line BL with the voltage at the second bit line BLB. The equalization process is to equalize the voltage at the first bit line BL with the voltage at the second bit line BLB for a subsequent precharge operation.

In the semiconductor memory device 1 according to an exemplary embodiment, during the precharge period P, the first PMOS transistor MP1 and the second PMOS transistor MP2 have a diode-connection crossing each other, so that the first bit line BL and the second bit line BLB are precharged to different voltages. As a result, even if mismatch occurs between the first PMOS transistor MP1 and the second PMOS transistor MP2, during the sensing period S, the voltage at the lower one of the bit lines decreases due to the cell current flowing in the memory cell, while the transistor connected to the other one of the bit lines is turned on so that positive feedback can be enabled immediately. In this manner, the read operation speed of the semiconductor memory device 1 can be improved. In addition, it is possible to precharge the first bit line BL and the second bit line BLB to voltages lower than the supply voltage $V_{DD}$ via the diode connection between the transistors, without any additional voltage source.

Figure 20:
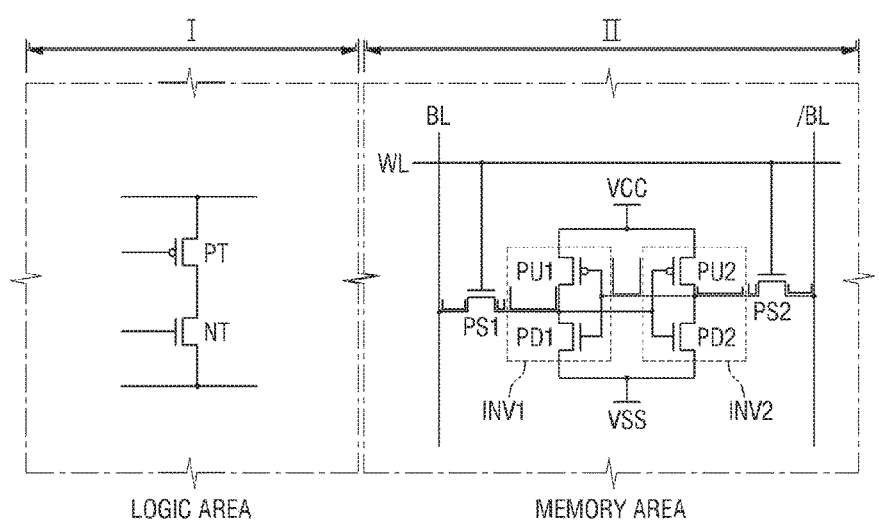
FIG. 20 is a diagram for illustrating a semiconductor memory device according to one or more exemplary embodiments.

FIG. 20 is a diagram for illustrating a semiconductor device 3 according to one or more exemplary embodiments.

Referring to FIG. 20, the semiconductor device 3 according to one or more exemplary embodiments may include a memory area in which a static random access memory (SRAM) is formed as a memory device, and a logic area.

The SRAM formed in the memory area may include a pair of inverters INV1 and INV2 connected between a power node Vcc and a ground node Vss in parallel, and a first pass transistor PS1 and a second pass transistor PS2 connected to output nodes of the inverters INV1 and INV2, respectively. The first pass transistor PS1 and the second pass transistor PS2 may be connected to the bit line BL and a complementary bit line /BL, respectively. Gates of the first pass transistor PS1 and the second pass transistor PS2 may be connected to a word line WL.

The first inverter INV1 includes a first pull-up transistor PU1 and a first pull-down transistor PD1 connected in series, and the second inverter INV2 includes a second pull-up transistor PU2 and a second pull-down transistor PD2 connected in series. The first pull-up transistor PU1 and the second pull-up transistor PU2 may be PMOS transistors, and the first pull-down transistor PD1 and the second pull-down transistor PD2 may be NMOS transistors.

In addition, in order to form a single latch circuit with the first inverter INV1 and the second inverter INV2, an input node of the first inverter INV1 is connected to an output node of the second inverter INV2, and an input node of the second inverter INV2 is connected to an output node of the first inverter INV1.

The logic device formed in the logic area may include a PMOS transistor PT and a NMOS transistor NT.

Figure 21:
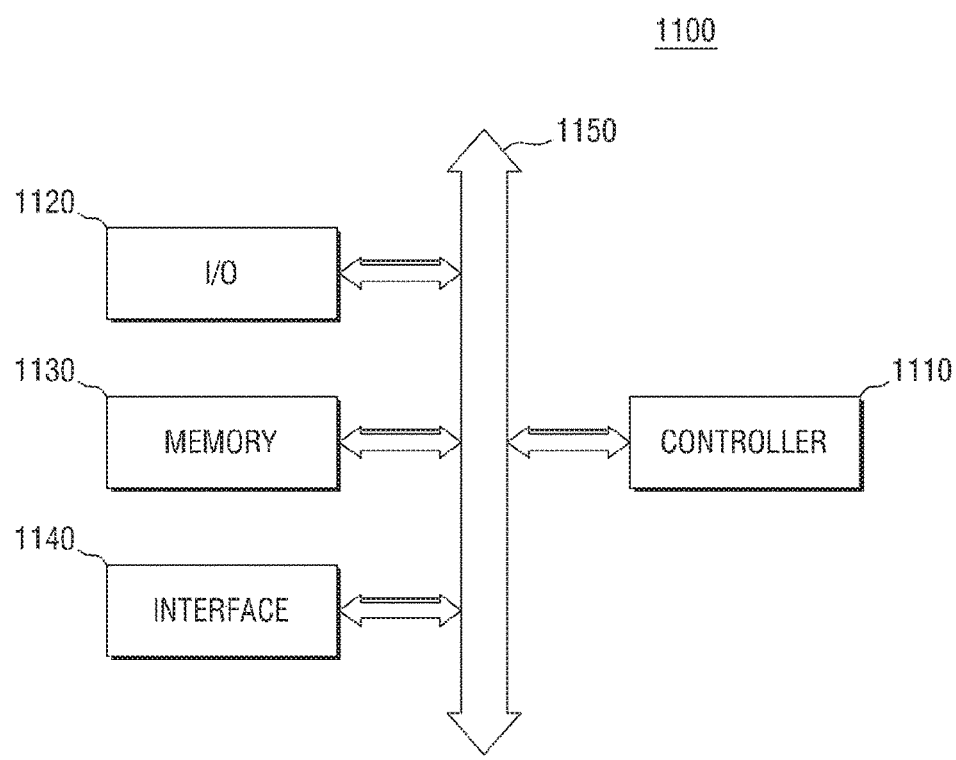
FIG. 21 is a block diagram of an electronic system including a semiconductor memory device according to one or more exemplary embodiments.

FIG. 21 is a block diagram of an electronic system 1100 including a semiconductor memory device according to one or more exemplary embodiments.

Referring to FIG. 21, the electronic system 1100 according to one or more exemplary embodiments may include a controller 1110, an input/output (I/O) device 1120, a memory device 1130, an interface 1140, and a bus 1150.

The controller 1110, the I/O device 1120, the memory device 1130 and/or the interface 1140 may be connected to one another via the bus 1150. The bus 1150 may serve as a path via which data is transferred.

The controller 1110 may include at least one of a microprocessor, a digital signal processor, a microcontroller, and logic elements capable of performing similar functions.

The I/O device 1120 may include a keypad, a keyboard, a display device, etc. The memory device 1130 may store therein data and/or instructions, for example.

The interface 1140 may be capable of transmitting/receiving data to/from a communication network. The interface 1140 may be either a wired or wireless interface. For example, the interface 1140 may include an antenna, a wired/wireless transceiver, or the like.

The electronic system 1100 is an operational memory for improving the operation of the controller 1100 and may further include a high-speed DRAM and/or SRAM, by way of example. The semiconductor memory device according to the above-described exemplary embodiments may be employed by the controller 1110.

Additionally, the semiconductor devices according to one or more exemplary embodiments may be provided in the memory device 1130 or may be provided as a part of the I/O device 1120, for example.

The electronic system 1100 may be implemented as a personal digital assistant (PDA), a portable computer, a web tablet, a wireless phone, a mobile phone, a digital music player, a memory card, an electronic product capable of transmitting/receiving information in a wireless environment, a personal computer (PC), an industrial computer, or a logic system capable of performing a variety of functions.

Figure 22:
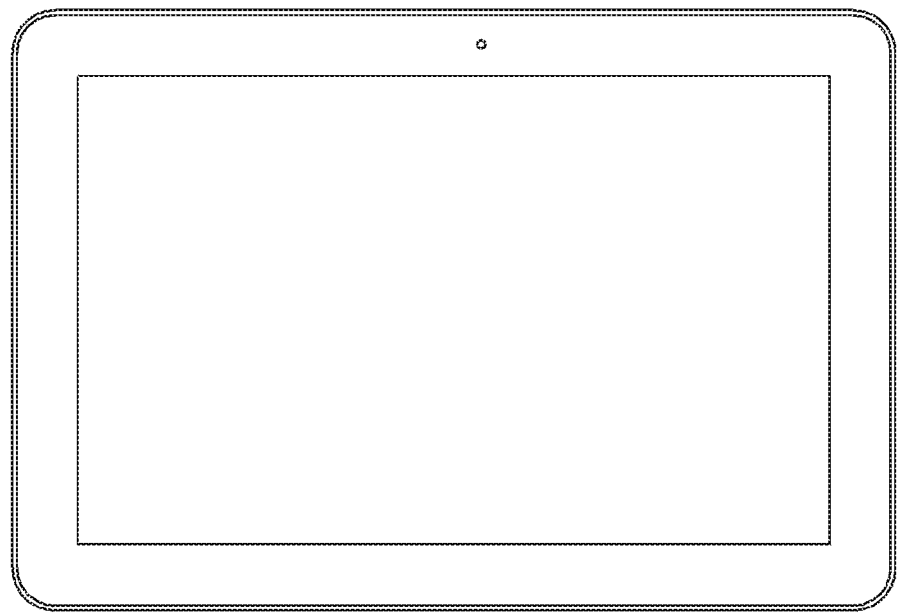
FIGS. 22 and 23 are views showing examples of semiconductor systems that can employ a semiconductor memory device according to one or more exemplary embodiments.
Figure 23:
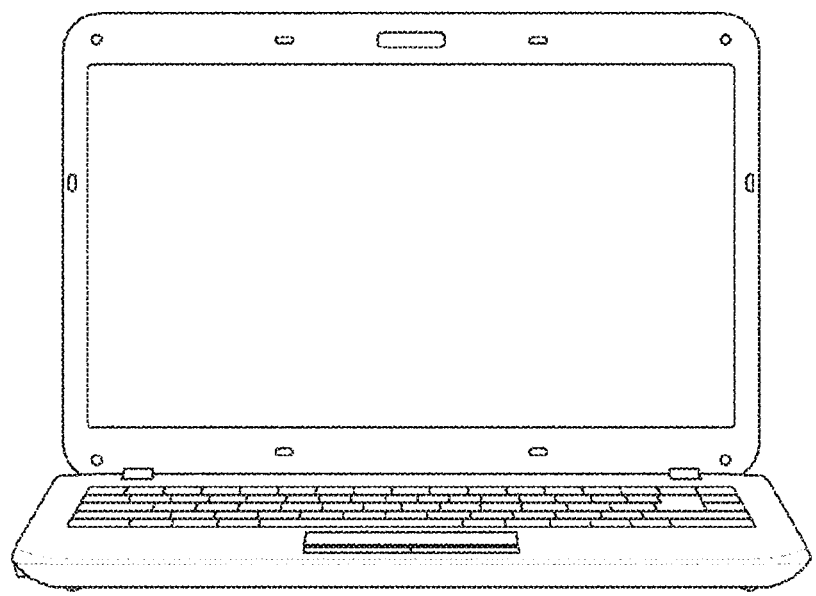

FIGS. 22 and 23 show examples of semiconductor systems that can employ the semiconductor memory devices according to one or more exemplary embodiments.

FIG. 22 shows a tablet PC, and FIG. 23 shows a laptop computer. The semiconductor memory devices according to one or more exemplary embodiments may be applied to a tablet PC, a laptop computer, a smartphone, etc. As will be appreciated by those skilled in the art, the semiconductor devices according to one or more exemplary embodiments may be employed by other integrated circuit devices than those mentioned above.

While exemplary embodiments have been particularly shown and described above, it will be understood by those of ordinary skill in the art that various changes in form and details may be made therein without departing from the spirit and scope of the present inventive concept as defined by the following claims. It is therefore desired that exemplary embodiments be considered in all respects as illustrative and not restrictive, reference being made to the appended claims rather than the foregoing description to indicate the scope of the inventive concept.

What is claimed is:

1. A semiconductor memory device comprising:
a memory cell;
a sensing circuit connected to the memory cell via a first bit line and a second bit line different from the first bit line, the sensing circuit configured to sense data stored in the memory cell; and
a bit line voltage control circuit connected to the memory cell via the first bit line and the second bit line, the bit line voltage control circuit configured to precharge the first bit line to a first voltage that is lower than a supply voltage and to precharge the second bit line to a second voltage that is lower than the supply voltage and is different from the first voltage,
wherein the bit line voltage control circuit is configured to precharge the first bit line to the first voltage and the second bit line to the second voltage during a precharge operation, and to amplify a difference value between the first voltage and the second voltage during a read operation subsequent to the precharge operation,
wherein the bit line voltage control circuit comprises a first transistor configured to precharge the second bit line to the second voltage and a second transistor configured to precharge the first bit line to the first voltage, and
wherein a first source node of the first transistor and a second source node of the second transistor are directly connected to a voltage source to receive the supply voltage for precharging the first bit line and the second bit line.

2. The semiconductor memory device of claim 1, wherein:
the first voltage is lower than the supply voltage by a second threshold voltage of the second transistor, and the second voltage is lower than the supply voltage by a first threshold voltage of the first transistor.

3. The semiconductor memory device of claim 2, wherein a first gate node of the first transistor is connected to the second bit line to precharge the second bit line to the second voltage, and a second gate node of the second transistor is connected to the first bit line to precharge the first bit line to the first voltage.

4. The semiconductor memory device of claim 3, wherein the bit line voltage control circuit further comprises a third transistor connected between the first gate node and a first drain node of the first transistor, and a fourth transistor connected between the second gate node and a second drain node of the second transistor.

5. The semiconductor device of claim 4, wherein each of the first to fourth transistors is a p-type MOSFET.

6. A semiconductor memory device comprising:
a memory cell connected between a first bit line and a second bit line; and
a bit line voltage control circuit connected between the first bit line and the second bit line, the bit line voltage control circuit configured to apply a first precharge voltage to the first bit line and a second precharge voltage to the second bit line,
wherein the bit line voltage control circuit comprises a first transistor, a second transistor, a first switch, and a second switch,
wherein a first gate node of the first transistor is connected to the second bit line,
wherein the first gate node and a first drain node of the first transistor are connected to the first switch,
wherein a second gate node of the second transistor is connected to the first bit line,
wherein the second gate node and a second drain node of the second transistor are connected to the second switch, wherein a first source node of the first transistor and a second source node of the second transistor are directly connected to a voltage source to receive a supply voltage for precharging the first bit line and the second bit line.

7. The semiconductor device of claim 6, wherein the first precharge voltage is different from the second precharge voltage.

8. The semiconductor memory device of claim 7, wherein the first precharge voltage is lower than a supply voltage by a second threshold voltage of the second transistor, and the second precharge voltage is lower than the supply voltage by a first threshold voltage of the first transistor.

9. The semiconductor memory device of claim 6, wherein the first switch and the second switch are switched on when a precharge operation is performed on the first bit line and the second bit line.

10. The semiconductor memory device of claim 9, wherein the first switch and the second switch are switched off when a sensing operation is performed on the memory cell.

11. The semiconductor device of claim 9, wherein each of the first switch and the second switch comprises a p-type MOSFET.

12. The semiconductor memory device of claim 6, wherein the bit line voltage control circuit further comprises a third switch connected between the first drain node of the first transistor and the first bit line, and a fourth transistor connected between the second drain node of the second transistor and the second bit line.

13. The semiconductor memory device of claim 12, wherein the third switch and the fourth switch are switched on when a sensing operation is performed on the memory cell.

14. A semiconductor memory device comprising:
a memory cell;
a sensing circuit configured to sense data stored in the memory cell; and
a bit line voltage control circuit connected to the memory cell via a first bit line and a second bit line,
wherein the bit line voltage control circuit is configured to apply a first precharge voltage to the first bit line and apply a second precharge voltage to the second bit line during a precharge period, the first precharge voltage being different from the second precharge voltage,
wherein a first voltage at the first bit line decreases and a second voltage at the second bit line increases during a sensing period, and
wherein the bit line voltage control circuit is configured to precharge the first bit line to the first precharge voltage and the second bit line to the second precharge voltage during a precharge operation, and to amplify a difference value between the first precharge voltage and the second precharge voltage during a read operation subsequent to the precharge operation,
wherein the bit line voltage control circuit comprises a first transistor configured to precharge the second bit line to the second voltage and a second transistor configured to precharge the first bit line to the first voltage, and
wherein a first source node of the first transistor and a second source node of the second transistor are directly connected to a voltage source to receive the supply voltage for precharging the first bit line and the second bit line.

15. The semiconductor memory device of claim 14, wherein:
a first gate node of the first transistor is connected to the second bit line to apply the second precharge voltage to the second bit line, and a second gate node of the second transistor is connected to the first bit line to apply the first precharge voltage to the first bit line.

16. The semiconductor memory device of claim 15, wherein the first precharge voltage is lower than a supply voltage by a second threshold voltage of the second transistor, and the second precharge voltage is lower than the supply voltage by a first threshold voltage of the first transistor.

17. The semiconductor memory device of claim 16, wherein the bit line voltage control circuit further comprises a first switch connected between the first gate node and a first drain node of the first transistor, and a second switch connected between the second gate node and a second drain node of the second transistor.

18. The semiconductor memory device of claim 16, wherein the bit line voltage control circuit further comprises a third switch connected between the first drain node of the first transistor and the first bit line, and a fourth transistor connected between the second drain node of the second transistor and the second bit line.

* * * * *

UNITED STATES PATENT AND TRADEMARK OFFICE
CERTIFICATE OF CORRECTION

PATENT NO. : 10,311,946 B2
APPLICATION NO. : 15/221875
DATED : June 4, 2019
INVENTOR(S) : Han-Wool Jeong et al.

Page 1 of 1

It is certified that error appears in the above-identified patent and that said Letters Patent is hereby corrected as shown below:

In the Specification

Column 1, title of invention, Line 2, "ASSYMETRIC" is replaced with "ASYMETRIC".

Signed and Sealed this
Thirtieth Day of July, 2019

Andrei Iancu
*Director of the United States Patent and Trademark Office*